United States Patent [19]

Randhawa et al.

[11] Patent Number: 5,341,048
[45] Date of Patent: Aug. 23, 1994

[54] CLOCK INVERT AND SELECT CIRCUIT

[75] Inventors: Hiten S. Randhawa, Santa Clara; Cheng-Yuan M. Wang, San Jose, both of Calif.

[73] Assignee: Altera Corporation, San Jose, Calif.

[21] Appl. No.: 981,442

[22] Filed: Nov. 25, 1992

[51] Int. Cl.$^5$ .............. H03K 19/096; H03K 19/094
[52] U.S. Cl. .................. 307/481; 307/451; 307/465; 307/269
[58] Field of Search ............ 307/269, 241–243, 307/451, 272.1, 481, 465, 244, 573

[56] References Cited

U.S. PATENT DOCUMENTS

| | | | |
|---|---|---|---|
| 4,613,773 | 9/1986 | Koike | 307/443 |
| 5,070,257 | 12/1991 | Farwell | 307/296.3 |
| 5,140,174 | 8/1992 | Meier et al. | 307/481 |
| 5,157,291 | 10/1992 | Shimoda | 307/243 |
| 5,220,217 | 6/1993 | Scarra et al. | 307/481 |

OTHER PUBLICATIONS

Altera Data Book, Sep. 1991, pp. 99–106.

*Primary Examiner*—Edward P. Westin
*Assistant Examiner*—Richard Roseen
*Attorney, Agent, or Firm*—Townsend and Townsend Khourie and Crew

[57] ABSTRACT

A system and method for selectively inverting a clock signal. Clock (CLK) and inverted clock (NCLK) signals are generated. A control signal (RCTL) and inverted control signal (NRCTL) operate the clock invert circuit (201). First (C1) and second (C2) output lines are coupled to both of the clock and inverted clock signals, but are selectively connected to one of such signals by way of the control and inverted control signals. According to a preferred aspect of the invention, the control signals are generated with an SRAM bit (207). The clock and inverted clock signals are used in, for example, a programmable logic device such as with a flip-flop (205) clock input.

11 Claims, 2 Drawing Sheets

CLOCK INVERT AND SELECT CIRCUIT

BACKGROUND OF THE INVENTION

The present invention relates to the field of semiconductor devices and circuits, and more specifically an improved system and method for selectively producing a clock or inverted clock signal.

Clock circuits and their use are well known in a wide variety of integrated circuit devices. It is often desirable in such devices to provide the ability to select between a clock signal and its inverse for use in a particular portion of an integrated circuit. Logic devices are exemplary of integrated circuits that use a clock signal and in which it is desirable to provide the ability to use the inverted version of the clock signal under selected circumstances. Programmable logic devices (sometimes referred to as PLDs, PALs, PLAs, FPLAs, PLDs, EPLDs EEPLDs, LCAs, or FPGAs) are a particular type of logic device that often provide for selection of a clock or an inverted clock in particular portions of a circuit therein. Such clock signals are used, for example, in flip-flops that provide registered output from such logic devices.

In one common embodiment, a clock signal is selectively inverted under the control of a memory bit. For example, a DRAM, EPROM, EEPROM, SRAM, or other stored data bit is used to control whether a circuit utilizes the clock or inverted clock signal. For example, in one type of programmable logic device, a clock is used in the operation of a flip-flop associated with a logic macrocell or logic array block (LAB). Based on the value stored in an SRAM bit, the device is able to selectively use either a global clock signal or its inverse in the flip-flop.

FIGS. 1A and 1B illustrate one prior circuit for selectively generating either a clock signal or its inverted value, and a specific use thereof. As shown in FIG. 1A, the output of a clock invert selection circuit 101 is used in a flip-flop 103. Flip-flop 103 may, for example, register output from programmable logic 105. A multiplexer 107 is used to select between registered and non-registered output from the flip-flop or the logic, respectively.

According to the clock invert selection circuit shown in more detail in FIG. 1B, the clock signal CLK is input to the circuit and its inverse is produced by an inverter I1. A RAM control bit 2 generates a RAM control signal RC and its inverse NRC. RC is provided at the gate of an NMOS transistor 3 while NRC (the inverted value of RC) is provided at the gate of an NMOS transistor 4. If RC is high, transistor 3 passes the value of CLK to a node 5. If RC is low, transistor 4 passes the inverted value of the clock signal to node 5.

The selected clock signal is usually buffered from external circuits by, for example, placing an inverter I2 at the output of the selection circuit. In most cases it is then desirable to regenerate both the selected clock signal and its inverse for usage in such external circuits. Accordingly, a node 6 provides the output signal C1, and provides input to an inverter I3, which provides the complementary output signal C2.

While meeting with substantial success, prior clock invert selection circuits have also met with certain limitations. For example, the gate delays of prior circuits have imposed speed limitations on such circuits. In particular, the circuit illustrated above generates a single output signal at node 6, from which the positive and negative values of the clock must be regenerated, which introduces extra gate delays. If such clock invert circuits operated more quickly, the operation of logic devices and other integrated circuits could be enhanced.

Accordingly, it is seen that an improved clock invert selection circuit is desired.

SUMMARY OF THE INVENTION

The present invention provides an improved clock invert selection circuit characterized by reduced gate delays.

According to one aspect of the invention, a clock signal and an inverted clock signal are input to a selection circuit along with a control signal. A first output line is selectively coupled to either the clock or inverted clock signals based on the value of the control signal. A second output line is also selectively coupled to the clock and inverted clock signals based on the control signal, but in an opposite sense. Thus, if the first output line is connected to the inverted clock, the second output line is connected to the clock signal, and vice versa. In a particular embodiment the control signal is a complementary pair.

Accordingly, the circuit selects between clock and inverted clock signals, and generates both clock and complementary clock signals without the need for regeneration of one of the clock signals. The clock and inverted clock signals will find a variety of uses such as in programmable logic devices. For example, the clock and inverted clock signals may be used in registering output in such logic devices via a D-type flip-flop.

In preferred embodiments, the invention requires only four gating elements and one inverter. The gating elements can be selected from a wide variety of devices such as MOS transistors, or CMOS transmission gates.

Accordingly, in one embodiment, the invention provides an integrated circuit having a clock invert selection circuit. The clock invert selection circuit includes an input line coupled to a periodic clock pulse signal and an inverter for producing an inverted periodic clock pulse signal from the periodic clock pulse signal. The invert select circuit also includes a first output line, a second output line, and a selection circuit. The selection circuit is adapted to: 1) couple the periodic clock pulse signal to the first output line when a control signal assumes a first state, and couple the inverted periodic clock pulse signal to the second output line when said the control signal assumes the first state; and 2) couple the periodic clock pulse signal to the second output line when the control signal assumes a second state, and couple said inverted periodic clock pulse signal to the first output line when the control signal assumes the second state.

A further understanding of the nature and advantages of the inventions herein may be realized by reference to the remaining portions of the specification and the attached drawings.

DESCRIPTION OF THE PREFERRED EMBODIMENTS

Figure 2:
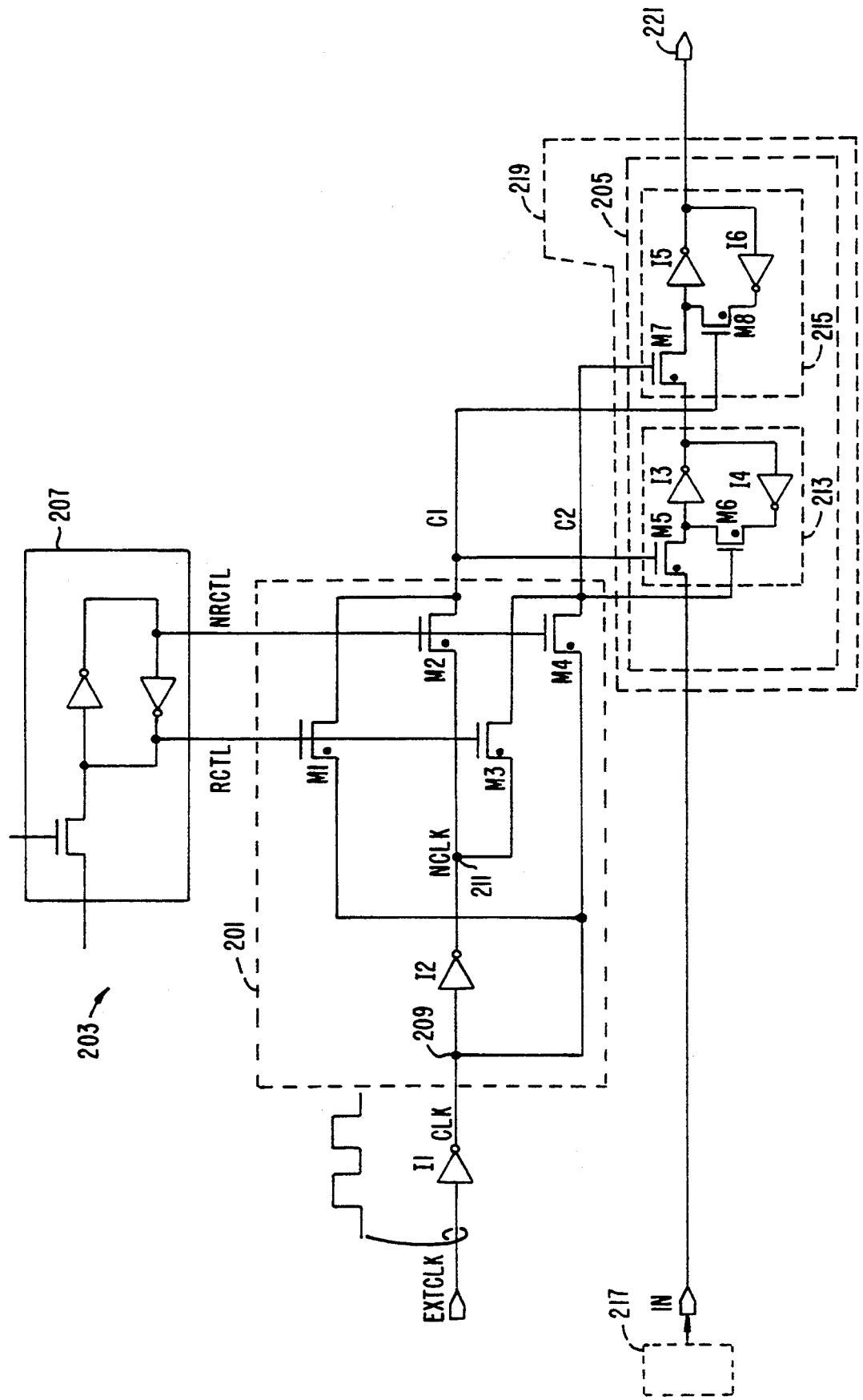
FIG. 2 is an illustration of one embodiment of a clock invert circuit according to the inventions herein.

FIG. 2 illustrates one preferred aspect of the invention. The invention is illustrated with reference to a clock invert selection circuit 201 used in a programmable logic device 203, but the invention is not so limited. The invention will find application in other devices such as microprocessors, ASICs, and a wide variety of other semiconductor devices.

As shown, the invention is used to select between a clock signal CLK and its inverse (180° shifted value). The selected signal (either the clock or the inverted clock) is placed on an output line C1. The circuit also generates the inverse of the selected clock on a line C2. According to one preferred aspect of the invention, the outputs of the circuit are used in a flip-flop 205 of the type well known to those of skill in the art, such as a D-type flip-flop.

Selection of the clock or its inverse for output to line C1 is based on the contents of a memory bit 207, such as an SRAM memory bit. While a SRAM memory bit is illustrated, a wide variety of memory devices such as an EPROM, EEPROM, PROM, ROM, DRAM, fuse, or antifuse device may be utilized in some embodiments. SRAM memory is preferred since it inherently generates both the true and complement control signals, aiding in layout compactness.

The memory bit generates both control and inverted control signals, RCTL and NRCTL respectively, for selection of the clock or inverted clock signals. In the case of an SRAM bit, the size of the transistors in the bit may be altered to account for the need to drive the clock invert selection circuit. For example, while the ratio of transistor sizes in the upper:lower inverters is normally about 12:1, it may be altered in some embodiments herein to provide ratios of 4:1 to 3:1.

A periodic clock signal EXTCLK is input to the circuit, and is inverted/buffered with an inverter I1 to generate the clock signal CLK. At a node 209, this signal is branched such that both CLK and an inverted version of CLK are generated. The inverted value of CLK, i.e., NCLK is generated with an inverter I2 at a node 211. Accordingly, CLK is available at node 209 and NCLK is available at node 211.

Output line C1 is coupled to either the NCLK or CLK lines based on the contents of memory bit 207. In particular, C1 is selectively coupled to CLK via a transistor M1. Transistor M1 is illustrated as an NMOS transistor, but it will be apparent that other gating circuits may be used for selectively coupling the various lines. C1 is coupled to NCLK via a transistor M2. Similarly, C2 may be coupled to either NCLK or CLK. C2 is coupled to CLK via a transistor M4, and C2 is coupled to NCLK via a transistor M3. The C1 and C2 lines are coupled to one of the source or drain of transistors M1, M2, M3, and M4, while the CLK and NCLK lines are coupled to the other of the source/drain of these transistors.

When RCTL is high, transistors M1 and M3 will be conductive. Accordingly, C1 is connected to the CLK signal, and C2 is connected to the NCLK signal. Conversely, when RCTL is low, NRCTL is high. Therefore, C1 is connected to the NCLK signal while C2 is connected to the CLK signal. Thus, circuit 203 generates both the selected clock or negative clock values at line C1, as well as its complement at line C2, without the need for regeneration of the inverse value of the selected clock. Using conventional technologies, the reduced delay resulting from the removal of a gate delay will typically increase the speed of the device by about 0.5 nsec.

FIG. 2 also illustrates application of the selected clock signals to a D within a programmable logic device 219 flip-flop 205. The flip-flop is of the type known to those of skill in the art, and described more fully in, for example, Sedra et al., *Microelectronic Circuits*, Second Edition, Ch. 15, incorporated herein by reference for all purposes. The flip-flop includes a master 213 and a slave 215. Master 213 includes conventionally connected transistors M5/M6, along with inverters I3 and I4, while slave 215 includes transistors M7 and M8, along with inverters I5 and I6. On a falling edge of the selected clock applied to C1, the registered output 221 adopts the value of an input IN just prior to the transition. Conversely, if RCTL is 0, i.e., NRCTL is 1, C1 will be NCLK and C2 will be CLK. The D flip-flop will then switch the output at a CLK rising edge.

The input IN may be coupled to any of a variety of circuits 217, such as the output of a sum-of-products (SOP) circuit in a programmable logic device, the output of a lookup table that performs logic functions, or the like.

Figure 1A:
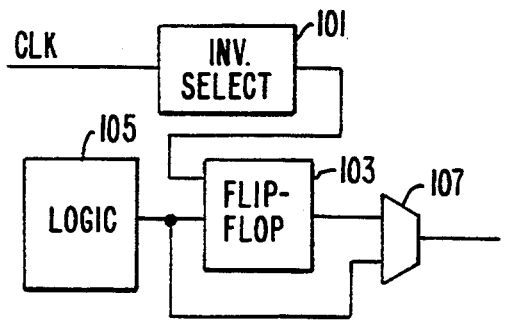
FIGS. 1A and 1B illustrate a prior clock invert circuit, along with an application thereof.
Figure 1B:
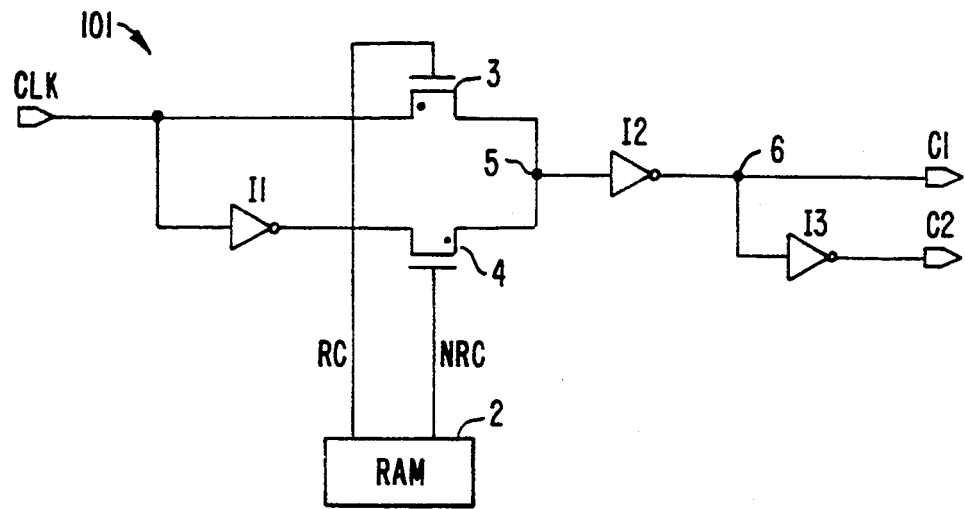
Figure 3:
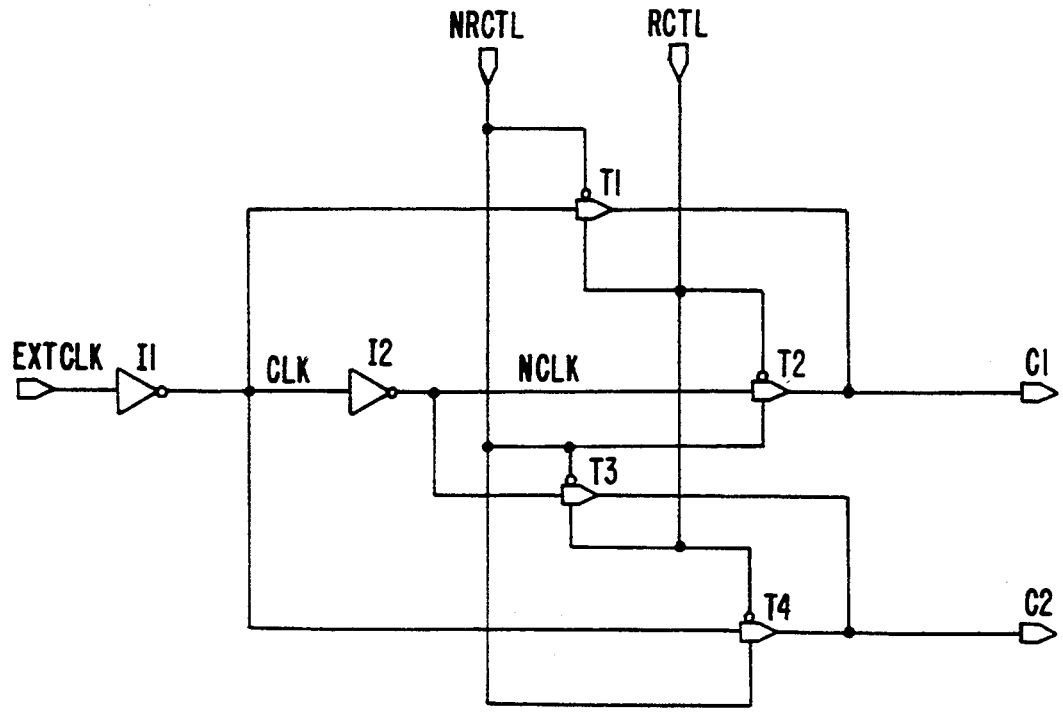
FIG. 3 is an illustration of another embodiment of a clock invert circuit according to the inventions herein.

FIG. 3 illustrates another embodiment of the invention. According to this embodiment of the invention, CMOS transmission gates T1, T2, T3, and T4 are utilized rather than NMOS pass transistors. Transmission gates and their use are well known to those of skill in the art and are described more fully in, for example, Sedra et al., *Microelectronic Circuits*, Second Edition, Ch. 7, incorporated herein by reference for all purposes.

As shown in FIG. 3, the EXTCLK is signal is buffered with inverter I1, to generate CLK, and the inverse of CLK (NCLK) is generated with inverter I2. NRCTL and RCTL are used to control whether CLK or NCLK is to be provided to the output line C1. Similar to the embodiment shown in FIG. 2, the circuit provides both the true and complement versions of the selected clock signal, without the need to regenerate the complement version of the selected clock.

Again, C1 is coupled to both CLK and NCLK. In this embodiment, transmission gates T1, T2, T3, and T4 select which clock should be output. In particular, transmission gates T1 and T2 select whether NCLK or CLK is to be provided to C1. When RCTL is high, T1 will transmit CLK to C1 (since RCTL is inverted at T2 and NRCTL is inverted at T1). Conversely, when RCTL is low, T2 transmits NCLK to C1. When RCTL is high, NCLK is transmitted by T3 to C2, and when RCTL is low, CLK is transmitted by T4 to C2. Again, the selected clock and its inverse are both generated by the circuit, without the need for regeneration of the negative clock.

One advantage of the invention is enhanced speed. Since there is one less gate delay in the path of the clock invert circuit, the speed of the device will be about 1 gate delay faster than other devices (where two inverters plus one gating element delay is encountered). Also, layout compactness is enhanced by eliminating the need to generate the clock pairs twice, as is the case in many approaches. This is accomplished by "keeping" the clock signal pair and its complement once they have been generated.

The above description is illustrative and not restrictive. Many variations of the invention will become apparent to those of skill in the art upon review of this disclosure. Merely by way of example particular circuit connections have been illustrated for simplicity, but additional elements may be added to the circuit such as buffer circuits and the like. Further, while the invention is illustrated with respect to implementations in a programmable logic device, the invention is not so limited and the invention may alternatively be applied to other integrated circuit devices. Still further, the invention may utilize P channel devices in lieu of N-channel and CMOS devices, and the like. The scope of the invention should, therefore, be determined not with reference to the above description, but instead should be determined with reference to the appended claims along with their full scope of equivalents.

What is claimed is:

1. In an integrated circuit, a clock invert selection circuit comprising:
   a clock for producing a periodic clock pulse signal;
   an input line coupling an input terminal of said clock invert selection circuit to an output terminal of said clock;
   an inverter with an output terminal, said inverter producing an inverted periodic clock pulse signal from said periodic clock pulse signal;
   a first output line;
   a second output line; and
   a selection circuit, said selection circuit:
   i) switching said clock output terminal to said first output line when a control signal assumes a first level, and switching said inverter output terminal to said second output line when said control signal assumes said first level; and
   ii) switching said clock output terminal to said second output line when said control signal assumes a second level, and switching said inverter output terminal to said first output line when said control signal assumes said second level.

2. The clock invert selection circuit of claim 1 wherein said first and said second output lines are coupled to a programmable logic device.

3. The clock invert selection circuit of claim 2 wherein said first and second output lines are coupled to a flip-flop in said programmable logic device.

4. The clock invert selection circuit of claim 3 wherein said flip-flop is coupled to a sum-of-products term from said programmable logic device, whereby said flip-flop provides registered output from said sum of products term.

5. The clock invert selection circuit of claim 1 wherein said control signal is generated in a static memory cell.

6. The clock invert selection circuit of claim 1 wherein said control comprises a complementary control signal which is the complement of said control signal and said control signal.

7. In an integrated circuit, a method of selecting between a clock and an inverted clock for output comprising:
   inputting a periodic clock pulse signal;
   inverting said periodic clock pulse to form an inverted periodic clock pulse signal;
   receiving a control signal;
   transmitting said periodic clock pulse signal through a first output line when a control signal assumes a first level, and transmitting said inverted periodic clock pulse signal through a second output line when said control signal assumes aid first level; and
   transmitting said periodic clock pulse signal through said second output line when said control signal assumes a second level, and transmitting said inverted periodic clock pulse signal through said first output line when said control signal assumes said second level.

8. A programmable logic device comprising:
   a sum-of-products circuit with an output line;
   an external clock with an external clock terminal;
   a complementary external clock with a complementary external clock terminal;
   a flip-flop comprising an input data line coupled to said sum-of-products circuit output line, a clock input line, an inverted clock input line, and an output data line;
   a clock invert selection circuit comprising:
   i) an external clock output line coupled to said external clock terminal;
   ii) a complementary external clock output line coupled to said complementary external clock terminal; and
   iii) first, second, third and fourth control gates, said first control gate coupling said external clock output line to said flip-flop clock input line when a control signal assumes a first level, said second control gate coupling said external clock output line to said flip-flop inverted clock input line when said control signal assumes a second level, said third control gate coupling said complementary external clock output line to said flip-flop clock input line when said control signal assumes said second level, said fourth control gate coupling said complementary external clock output line to said flip-flop inverted clock input line when said control signal assumes said first level.

9. In an integrated circuit, a clock invert selection circuit comprising:
   a clock for producing a periodic clock pulse signal;
   an input line coupling an input terminal of said clock invert selection circuit to an output terminal of said clock;
   an inverter with an output terminal, said inverter producing an inverted periodic clock pulse signal from said periodic clock pulse signal;
   a first output line;
   a second output line; and
   a selection circuit comprising first, second, third, and fourth gating elements and wherein:
   said first gating element couples said clock output terminal to said first output line when said control signal assumes a first level;
   said second gating element couples said inverter output terminal to said first output line when said control signal assumes a second level;
   said third gating element couples said clock output terminal to said second output line when said control signal assumes said second level; and
   said fourth gating element couples said inverter output terminal to said second output line when said control signal assumes said first level.

10. The clock invert selection circuit of claim 9 wherein said first, second, third, and fourth gating elements are MOS transistors.

11. The clock invert selection circuit of claim 9 wherein said first, second, third, and fourth gating elements are CMOS transmission gates.

* * * * *